United States Patent
Hao

(10) Patent No.: US 6,188,564 B1
(45) Date of Patent: Feb. 13, 2001

(54) METHOD AND APPARATUS FOR COMPENSATING NON-UNIFORM WAFER PROCESSING IN PLASMA PROCESSING CHAMBER

(75) Inventor: Fangli J. Hao, Cupertino, CA (US)

(73) Assignee: Lam Research Corporation, Fremont, CA (US)

(*) Notice: Under 35 U.S.C. 154(b), the term of this patent shall be extended for 0 days.

(21) Appl. No.: 09/282,644

(22) Filed: Mar. 31, 1999

(51) Int. Cl.$^7$ .................................................. H02N 13/00
(52) U.S. Cl. ............................................................. 361/234
(58) Field of Search ................... 361/230–234; 279/128

(56) References Cited

U.S. PATENT DOCUMENTS

| | | | |
|---|---|---|---|
| 3,941,966 | 3/1976 | Schatz | 219/10.49 |
| 5,187,454 | 2/1993 | Collins et al. | 333/17.3 |
| 5,463,526 | 10/1995 | Mundt | 361/234 |
| 5,609,720 | 3/1997 | Lenz et al. | 156/643.1 |
| 5,612,851 * | 3/1997 | Barnes et al. | 361/234 |
| 5,670,066 | 9/1997 | Barnes et al. | 219/121.58 |
| 5,671,116 | 9/1997 | Husain | 361/234 |
| 5,689,215 | 11/1997 | Richardson et al. | 333/17.3 |
| 5,708,250 | 1/1998 | Benjamin et al. | 219/121.58 |
| 5,737,175 | 4/1998 | Grosshart et al. | 361/234 |
| 5,793,162 | 8/1998 | Barnes et al. | 315/111.21 |
| 5,793,192 | 8/1998 | Kubly et al. | 323/312 |
| 5,798,904 | 8/1998 | Guyot | 361/234 |
| 5,812,361 | 9/1998 | Jones et al. | 361/234 |
| 5,835,335 | 11/1998 | Ross et al. | 361/234 |
| 5,914,568 | 6/1999 | Nonaka | 315/111.21 |
| 5,933,314 * | 8/1999 | Lambson et al. | 361/234 |

FOREIGN PATENT DOCUMENTS

| | | |
|---|---|---|
| 04073950 | 3/1992 | (EP) . |
| 05226462 | 9/1993 | (EP) . |
| 0 663 682 A1 | 7/1995 | (EP) . |
| 10261698 | 9/1998 | (EP) . |

OTHER PUBLICATIONS

M. Lieberman and A. Lichtenberg, *"Principles of Plasma Discharges and Materials Processing"*, © 1994, Wiley Interscience Publ., John Wiley & Sons, Inc.

* cited by examiner

Primary Examiner—Michael J. Sherry
(74) Attorney, Agent, or Firm—Martine Penilla & Kim, LLP

(57) ABSTRACT

A method and apparatus for compensating non-uniform wafer processing in a plasma processing chamber. The plasma processing chamber has an electrostatic chuck for clamping a wafer. The electrostatic chuck has one or more layers. A first wafer is processed on an electrostatic chuck in a first plasma processing chamber by exposing the first wafer to a plasma. Then, non-uniformity characteristics of the processed first wafer are determined. Based on the non-uniformity characteristics, one or more layers of the electrostatic chuck are configured to substantially compensate for the non-uniformity characteristics. A second wafer is then processed on the configured electrostatic chuck to produce substantially uniform process results.

36 Claims, 10 Drawing Sheets

METHOD AND APPARATUS FOR COMPENSATING NON-UNIFORM WAFER PROCESSING IN PLASMA PROCESSING CHAMBER

BACKGROUND OF THE INVENTION

1. Field of the Invention

The present invention relates to the manufacture of semiconductor devices. More specifically, the present invention relates to method and apparatus for improving uniformity of wafers during plasma processing in a semiconductor plasma processing system.

2. Description of the Related Art

Semiconductor processing systems are used to process semiconductor wafers for fabrication of integrated circuits. In particular, plasma-enhanced semiconductor processes are commonly used in etching, oxidation, chemical vapor deposition (CVD), etc. The plasma-enhanced semiconductor processes are typically carried out by means of plasma processing systems and generally include a plasma processing chamber to provide a controlled setting.

Conventional plasma processing chambers often include electrostatic chucks to hold a wafer (e.g., silicon wafer or substrate) in place for processing. Electrostatic chucks utilize electrostatic force to clamp the wafer to the chuck and are generally classified into monopolar and bipolar electrostatic chucks. Monopolar electrostatic chucks have a single pole whereas the bipolar electrostatic chucks have two poles. Electostatic chucks are well known in the art and are amply described, for example, in commonly owned U.S. Pat. No. 5,789,904 by Francois Guyot and entitled "High Power Electrostatic Chuck Contact," U.S. patent application Ser. No. 08/624,988 by Jones et al. and entitled "Dynamic Feedback Electrostatic Wafer Chuck," U.S. patent application Ser. No. 08/550,510 by Castro et al., and U.S. Pat. No. 5,793,192 by Kubly et al. and entitled "Methods and Apparatus for Clamping and Declamping a Semiconductor Wafer in a Wafer Processing System." The disclosures of these references are incorporated herein by reference.

FIG. 1 illustrates a cross-sectional view of an exemplary electrostatic chuck (ESC) 100 for clamping a wafer 102. The electrostatic chuck 100 includes dielectric layers 106 and 110, and a layer of electrode 108. The electrode 108 is disposed between the dielectric layers 106 and 108 and is configured as a pair of poles 108A and 108B in a bipolar ESC arrangement with an insulator provided therebetween.

The poles 108A and 108B are coupled to a positive and negative terminals of a power supply 112. Hence, the pole 108A is biased positively while the pole 108B is biased negatively. The bias potential of the poles 108A and 108B induces charges in the adjoining surface regions of the dielectric layers 106 and 110. For example, negative charges are induced on the bottom surface region 116 of the dielectric layer 106 that lies over the pole 108A. On the other hand, positive charges are induced at the upper surface region 118 of the dielectric layer 106 opposite of the bottom surface region 116. Similarly, positive charges are induced on the bottom surface region 120 of the dielectric layer 106 disposed over the pole 108B and negative charges build up on the opposite top surface region 122 of the dielectric layer 106.

The positive and negative charges on the top surface regions 118 and 122 of the dielectric layer 106, in turn, induce charges to be built up along the bottom surface regions 124 and 126 of the wafer 102. The induced potential between the dielectric layer 106 and the wafer 102 produces an electrostatic force that allows the wafer 102 to be clamped to the electrostatic chuck 100. With the wafer 102 clamped, plasma source gases are released into a plasma region 128 over the wafer for plasma processing such as etching, vapor deposition, sputtering, or the like until a desired degree of etching or deposition has been achieved.

Unfortunately, such plasma processes typically do not yield a uniform result due to non-uniform distribution of plasma over the wafer 102. For example, FIG. 2A shows an exemplary graph 200 depicting sputtering rate over a wafer. A curve 202 plots a sputtering rate of plasma over the radial distance from the center 204 of the wafer 102. As shown in the graph 200, the sputtering rate increases as the radial position nears the center 204 of the wafer. Conversely, the sputtering rate decreases as the radial distance of the wafer 102 increases from the center 204 and then increases sharply near the edge of the wafer.

The non-uniform distribution of plasma over the wafer typically produces a process result that is non-uniform across the entire surface of the wafer. FIG. 2B illustrates an etched surface 210 of a wafer after etching it in a conventional plasma processing chamber. Before the etching process, the surface of the wafer is assumed to be a uniform surface 212 for illustration purposes. After the etching process, the surface 210 of the wafer forms an upward incline from the center 214 of the wafer in either direction. In particular, the etched surface 210 shows that the center 214 of the wafer is etched more than neighboring regions due to greater concentration of plasma in the center region.

FIG. 2C shows deposition uniformity of a wafer surface over the radial distance after performing plasma deposition in a conventional plasma processing chamber. The dotted line 220 corresponds to the surface of the wafer before the plasma deposition. After the plasma deposition process, the resulting surface 222 of the wafer slopes downward from a peak at the center 224 of the wafer. The resulting surface 222 of the wafer generally reflects the plasma distribution or sputtering rate illustrated above in FIG. 2A. The non-uniform surface characteristics of wafers resulting from such plasma etching and deposition processes are undesirable because they reduce yield per wafer and throughput.

A traditional method has improved plasma uniformity by using a shower head with additional apertures or holes disposed over the sides of a wafer. These additional apertures or holes are designed to allow the shower head to release more plasma source gases. Hence, more plasma is produced in the regions located away from the center of the wafer, thereby compensating for lower plasma distribution in these regions. This approach, while improving process uniformity to a degree, is highly sensitive to the distance between the shower head and the wafer. For example, if the shower head is too far from the wafer, plasma source gases released from the shower head may not be uniformly distributed, thereby leading to non-uniform distribution of plasma. On the other hand, if the wafer is too close to the shower head, the plasma source gases may not have sufficient time to distribute uniformly.

Another solution has implemented a magnetic confinement ring around a shower head or an electrostatic chuck to confine the plasma within the area defined by the ring. By thus confining the plasma, the ring is designed to increase plasma concentration over the outer radial regions of the wafer. Unfortunately, however, the magnetic confinement ring often produces well-known cusp effect on the peripheral surface of the wafer due to the magnetic field of the confinement ring.

Furthermore, producing uniformly distributed plasma over a wafer may have the undesirable effect of reducing plasma density. This is because a wafer exposed to the reduced plasma density generally takes more time to produce a desired etch or deposition result than a wafer subject to a higher plasma density. Hence, the etch or deposition process may take longer to complete in a uniformly distributed plasma environment.

In view of the foregoing, what is needed is a method and apparatus for improving wafer processing uniformity during plasma processing without substantially increasing the processing time and without substantial sensitivity to the wafer distance from the source of plasma source gases

SUMMARY OF THE INVENTION

Broadly speaking, the present invention fills these needs by providing a method and apparatus for compensating non-uniform plasma processing in a plasma processing chamber. It should be appreciated that the present invention can be implemented in numerous ways, including as a process, an apparatus, a system, a device, a method, or a computer readable medium. Several inventive embodiments of the present invention are described below.

In accordance with one embodiment, the present invention provides a method for compensating non-uniform plasma processing in a plasma processing chamber. The plasma processing chamber has an electrostatic chuck for clamping a wafer. The electrostatic chuck has a plurality of layers. A first wafer (e.g., sample wafer) is processed on an electrostatic chuck in a first plasma processing chamber by exposing the first wafer to a plasma. Then, non-uniformity characteristics of the processed first wafer are determined. Based on the non-uniformity characteristics, one or more layers of the electrostatic chuck are configured to substantially compensate for the non-uniformity characteristics. A second wafer is then processed on the configured electrostatic chuck to produce substantially uniform process results.

In another embodiment, the present invention provides a method for compensating non-uniform plasma processing in a plasma processing chamber. The plasma processing chamber has an electrostatic chuck for clamping a wafer and an electrode disposed over the wafer. A first wafer is processed on the electrostatic chuck in a first plasma processing chamber by exposing the first wafer to a plasma. From the processed first wafer, non-uniformity characteristics are determined. Then, the electrode is configured into a plurality of electrically partitioned portions to substantially compensate for the non-uniformity characteristics on the processed first wafer. Using the configured electrode, a second wafer is processed in the plasma processing chamber to produce substantially uniform process results.

In accordance with another embodiment, the present invention provides an electrostatic chuck for clamping a wafer during plasma processing in a plasma processing chamber. The electrostatic chuck includes a first layer and an electrode. The electrode is disposed under the first layer for transmitting RF power to a plasma. The first layer has a varying first impedance adapted to produce a varying DC bias on the wafer such that the plasma (i.e., ions) in the plasma processing chamber is attracted to the wafer in a substantially uniform manner.

Advantageously, the present invention provides an efficient method and apparatus for compensating non-uniform wafer processing in a plasma processing chamber. By varying the thickness of layers and adding other impedance elements, varying DC bias on a wafer and/or varying plasma density distribution is produced. The varying DC bias functions to compensate for non-uniform plasma processing over the wafer by attracting plasma (i.e., ions) in a substantially uniform manner over the entire wafer surface. These and other advantages of the present invention will become apparent upon reading the following detailed descriptions and studying the various figures of the drawings.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described herein for a method and apparatus for compensating non-uniform wafer processing in a plasma processing chamber. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 3:
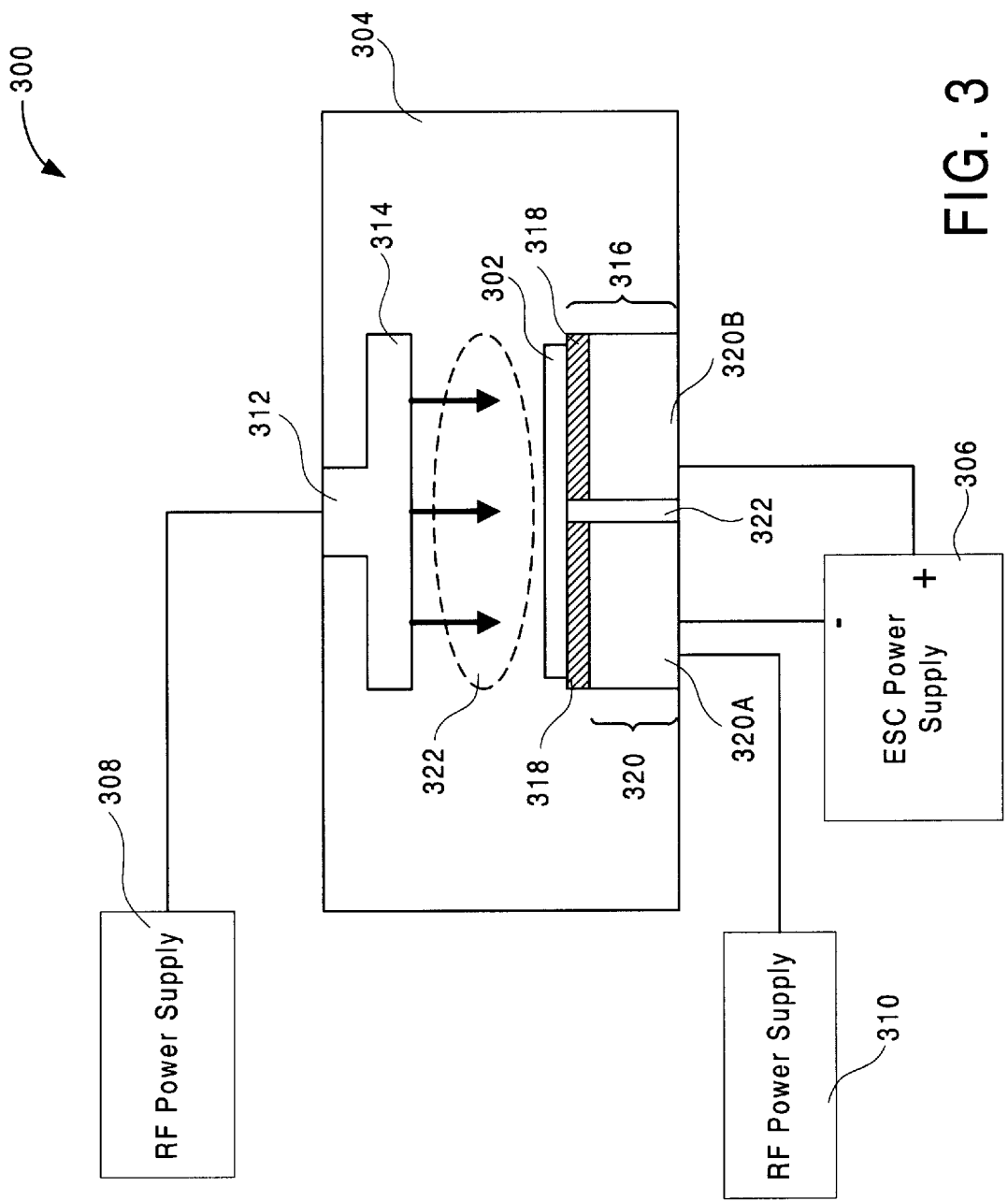
FIG. 3 illustrates an exemplary plasma processing system for processing a semiconductor wafer in accordance with one embodiment of the present invention.

FIG. 3 illustrates an exemplary plasma processing system 300 for processing a semiconductor wafer 302 in accordance with one embodiment of the present invention. The plasma processing system 300 includes a plasma processing chamber 304, an ESC power supply 306, and a pair of RF power supplies 308 and 310. The plasma processing chamber 304 includes a shower head 312 and a bipolar electrostatic chuck 316. The shower head 312 is used to introduce source gases into a plasma region 322 over the wafer 302 in the plasma processing chamber 304. The wafer 302 is disposed and clamped over the electrostatic chuck 316 for plasma processing. A top electrode 314 may be disposed on the shower head 312 as a single assembly unit. The shower head 312 and/or electrode 314 may be made of any suitable material such as aluminum, silicon, graphite, or the like.

The electrostatic chuck 316 includes a dielectric layer 318 formed over a metal layer 320 in a bipolar arrangement. The dielectric layer 318 may be formed of one or more dielectric materials having suitable impedance characteristics. The metal layer 320 includes a pair of poles 320A and 320B and is adapted to function as electrostatic poles (i.e., electrodes). The poles 320A and 320B are coupled to a negative and positive terminals, respectively, of the ESC power supply 306. In this manner, the pole 320A functions as a negative pole while the pole 320B operates as a positive pole. A gas (e.g., helium) is provided under pressure via one or more feed-tubes 322 through the electrostatic chuck 316 to the wafer 302. The gas acts as a cooling medium to facilitate control of the wafer temperature during plasma processing. The electrostatic chuck 316 may have other layers disposed over, under, or between the layers 318 and 320. Although a bipolar electrostatic chuck is illustrated herein, it should be borne in mind that the plasma processing system can also be used with other monopolar and bipolar electrostatic chucks having any number and types of layers.

The RF power supply 308 provides RF power to the electrode 314 disposed on the shower head 312 to excite the plasma in the plasma processing chamber 304. Similarly, the RF power supply 310 is arranged to provide RF power to the electrostatic chuck 316. The RF power supplies 308 and 310 may be any RF power devices suitable to generate RF power such as coils, plates, etc.

When the RF and ESC power supplies 308, 310, and 306 are activated along with the shower head 312 to release source gases into the plasma region, plasma is created from the source gases in the plasma region 322 over the wafer 302. The created plasma includes positive and negative charges. The positive charges are commonly referred to as ions. At the same time, the negative and positive poles 320A and 320B of the electrode layer 320 induce electrostatic forces between the poles and the respective overlaying wafer regions. The wafer 302 is thereby clamped to the electrostatic chuck 316 by the electrostatic forces during the plasma processing.

In one embodiment, the ESC power supply 306 is a high power device capable of delivering up to thousands of volts (e.g., ±2,000 volt). The ESC power supply 306 delivers a DC voltage while the RF power supplies 308 and 310 deliver a radio frequency power. It should be appreciated that the plasma processing system 300 is described in detail herein to facilitate understanding of the advantages of the present invention. However, the invention itself is not limited to any particular type of wafer processing apparatus or system and may be adapted for use in any suitable wafer processing systems, including but not limited to those adapted for deposition, oxidation, etching (including dry etching, plasma etching, reactive ion etching (RIE), magnetically enhanced reactive ion etching (MERIE), electron cyclotron resonance (ECR)), or the like.

With continuing reference to FIG. 3, a DC bias voltage is typically developed over the wafer 302 during the operation of the plasma processing system 300 in both the monopolar and bipolar ESC arrangements. The development of such DC bias is well known in the art. As will be discussed in more detail below, the present invention arranges the geometry and/or material of one or more layers in an electrostatic chuck or a top electrode to produces varying DC bias over the wafer to attract plasma (i.e., ions) in a substantially uniform manner over the entire surface of the wafer.

Figure 4A:
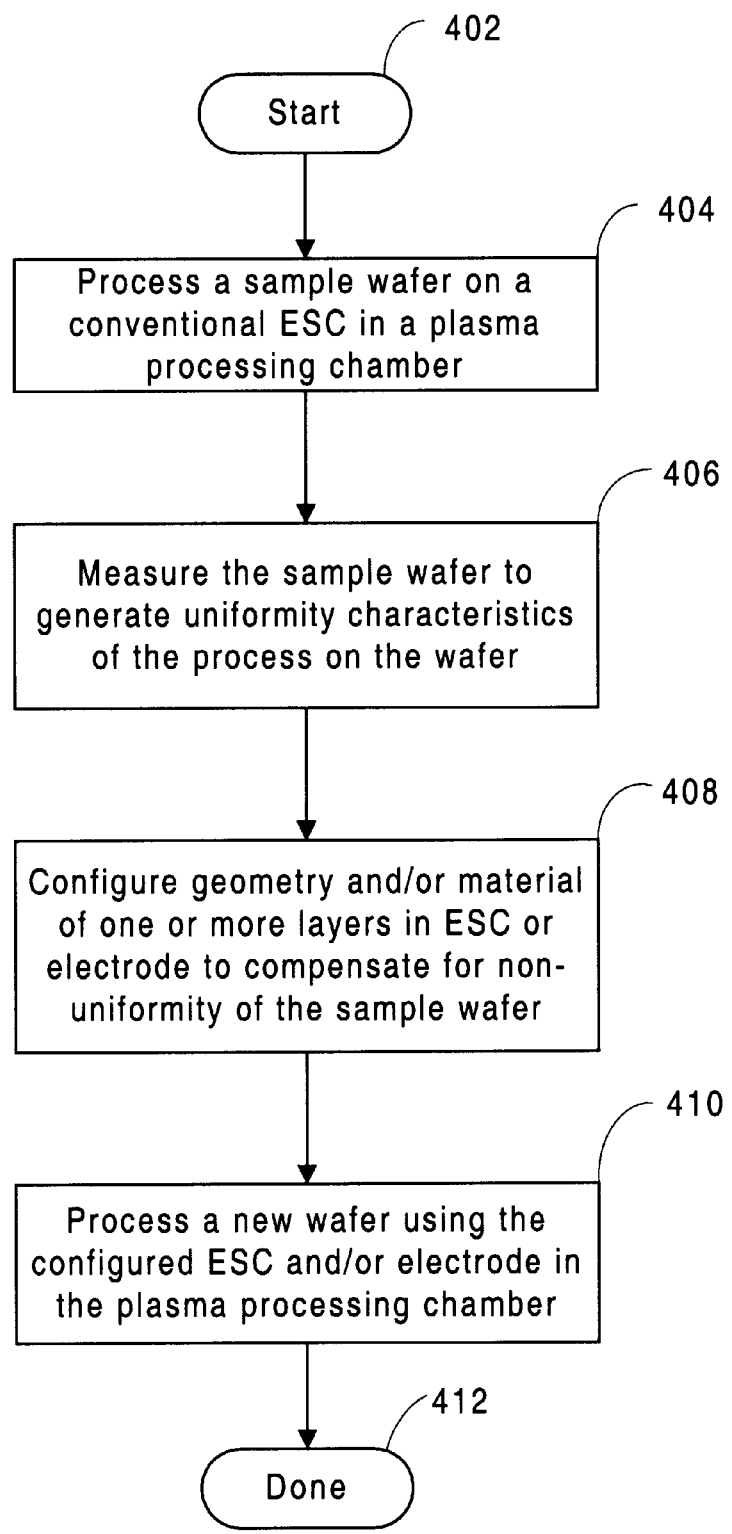
FIG. 4A shows a flowchart of a method for providing uniform wafer processing in a plasma processing chamber in accordance with one embodiment of the present invention.

FIG. 4A shows a flowchart of a method for providing uniform wafer processing in a plasma processing chamber in accordance with one embodiment of the present invention. The method begins in operation 402 and proceeds to operation 404, where a sample wafer is processed on a conventional electrostatic chuck in a plasma processing chamber. The wafer processing may involve subjecting the sample wafer to any suitable plasma processing such as etching, deposition, sputtering, etc.

After the completion of the wafer processing, the sample wafer is measured, preferably outside the plasma processing chamber, to generate process uniformity characteristics of the processed wafer in operation 406. Preferably, the process uniformity characteristics are obtained by measuring the processing uniformity result of a process (e.g., etch, deposition, etc.) at a plurality of radial positions of the wafer. For example, the resulting depths of a process such as etching or deposition can be measured at various locations on the wafer as a function of the radial position of the wafer. In this manner, the process uniformity characteristics correlate the uniformity of the process over the radial width of the wafer. The uniformity characteristics may be plotted to generate a calibration curve, tabulated in a table, or the like.

Then in operation 408, one or more layers in the electrostatic chuck or a top electrode over the wafer is configured to compensate for the non-uniformity of the sample wafer in accordance with the process uniformity characteristics. In one embodiment, the present invention configures the geometry (i.e., shape) of one or more layers of electrostatic chuck or the electrode. The geometry is adapted to provide impedance that substantially compensates for non-uniform processing characteristics of a wafer as illustrated in the process uniformity characteristics.

In another embodiment, the present invention configures the material of one or more layers of electrostatic chuck or the top electrode. For example, a selected layer is partitioned into a plurality of portions, which are formed of a plurality of materials, preferably one material per portion. The material properties of the portions are adapted to provide varying impedance over the radial distance of the wafer that substantially compensates for non-uniform processing characteristics. In yet another embodiment, the geometry and material configurations may be combined to provide the impedance needed to compensate for non-uniform processing characteristics of the wafer.

The configured electrostatic chuck and/or electrode are then placed in the plasma processing chamber for use in processing new wafers. In operation 410, a new wafer is processed in the newly configured plasma processing chamber. Since the electrostatic chuck and/or the electrode have been configured to attract plasma (i.e., ions) in a substantially uniform manner over the surface of a wafer, the resulting wafer exhibits substantially uniform process characteristics. After the processing, the method terminates in operation 412. Although a single wafer is illustrated herein, a plurality of wafers may be processed simultaneously in a plasma processing chamber. For example, a plurality of sample wafers may be processed to generate process uniformity characteristics for each wafer. In addition, a plurality of new wafers may be processed using the configured electrostatic chuck or top electrode in the chamber.

Figure 4B:
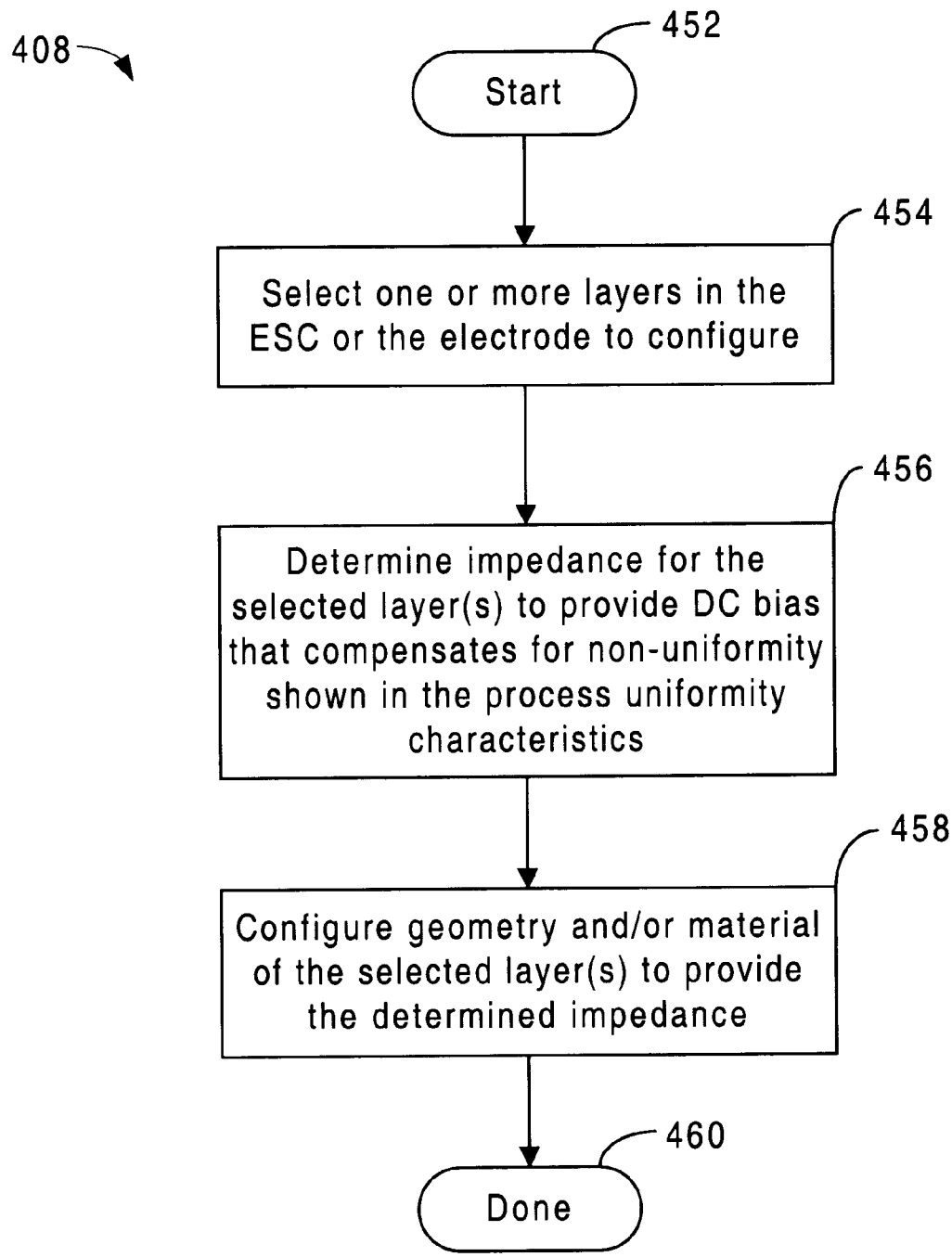
FIG. 4B shows a method for configuring the geometry and/or material in accordance with one embodiment of the present invention.

FIG. 4B shows a more detailed method operation 408 for configuring the geometry and/or material in accordance with one embodiment of the present invention. The method begins in operation 452 and proceeds to operation 454, where one or more layers in the ESC or the top electrode are selected for configuring. As described above, the ESC may include a plurality of dielectric layers, electrode layers, etc.

Then in operation 456, impedance for the selected layers is determined to provide DC bias to the wafer that substantially compensates for the measured non-uniformity as illustrated by the process uniformity characteristics. The determination of impedance to provide various DC bias is well known in the art. For example, the impedance can be determined by using well known equations described by Coulomb's law, Gauss's law, and the like. Next in operation 458, geometry and/or material of the selected layers is configured to provide the determined impedance. The method then terminates in operation 460.

FIGS. 5A through 5E shows cross-sectional views of a plurality of electrostatic chucks. Each of the electrostatic chucks includes a plurality of layers such as electrode layer, dielectric layer, etc. However, it should be appreciated that the electrostatic chucks are exemplary only and they may have any number of layers and materials in any suitable order to provide uniform plasma processing over a wafer. In addition, the top electrode also may be configured in a manner similar to the electrostatic chuck by configuring its geometry and/or material in accordance with uniformity characteristics.

Figure 5A:
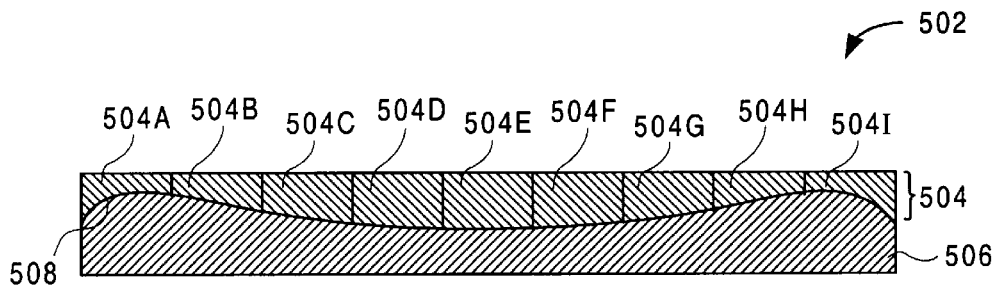
FIG. 5A illustrates a cross-sectional view of an exemplary electrostatic chuck having a geometry adapted to compensate for non-uniform process characteristics.

FIG. 5A illustrates a cross-sectional view of an exemplary electrostatic chuck 502 having a geometry adapted to compensate for non-uniform process characteristics in accordance with one embodiment of the present invention. The electrostatic chuck 502 includes a dielectric layer 504 disposed over an electrode layer 506. While the top of the dielectric layer 504 is even, its bottom surface 508 is curved to provide a varying thickness across the dielectric layer 504. In a preferred embodiment, the dielectric layer 504 is partitioned into a plurality of portions 504A, 504B, 504C, 504D, 504E, 504F, 504G, 504H, and 504I (hereinafter referred to as "504A through 504I"). Even though such a partitioned layer is illustrated herein, it should be appreciated that the present invention may also work with a dielectric layer that has not been partitioned into portions.

Each of the portions 504A through 504I is partitioned to electrically isolate each portion from its adjacent portions. The portions 504A through 504I is preferably formed of same material, but different materials may also be used. The electrode layer 506 complements the bottom surface 508 of the dielectric layer 504.

Figure 1:
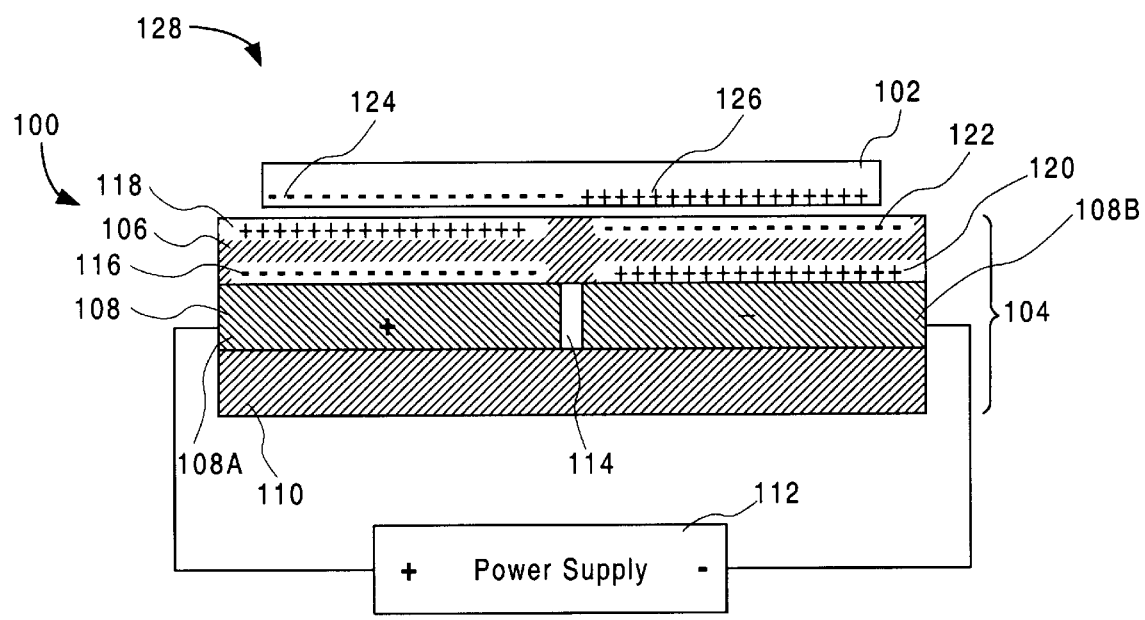
FIG. 1 illustrates a cross-sectional view of an exemplary electrostatic chuck for clamping a wafer.
Figure 2A:
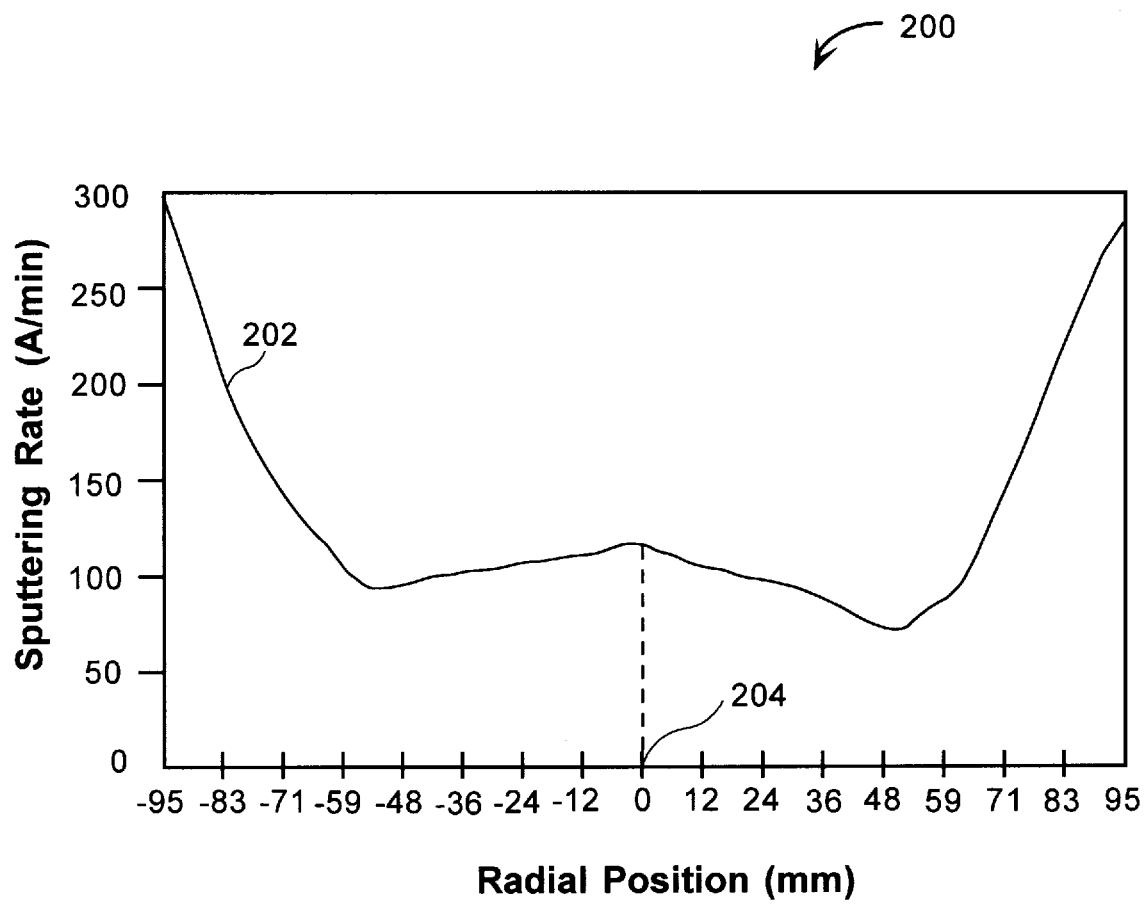
FIG. 2A shows an exemplary graph depicting sputtering rate over a wafer.
Figure 2B:
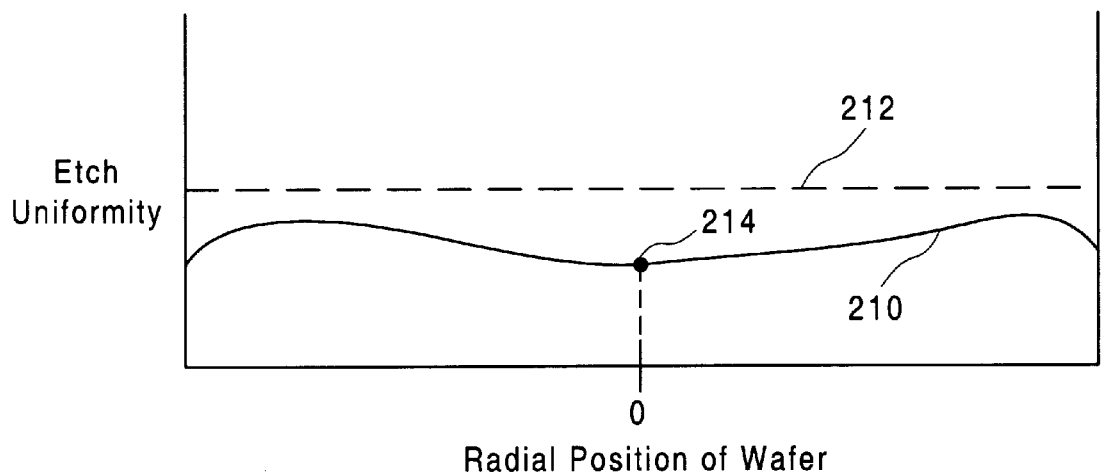
FIG. 2B illustrates etched surface of a wafer after etching it in a conventional plasma processing chamber.
Figure 2C:
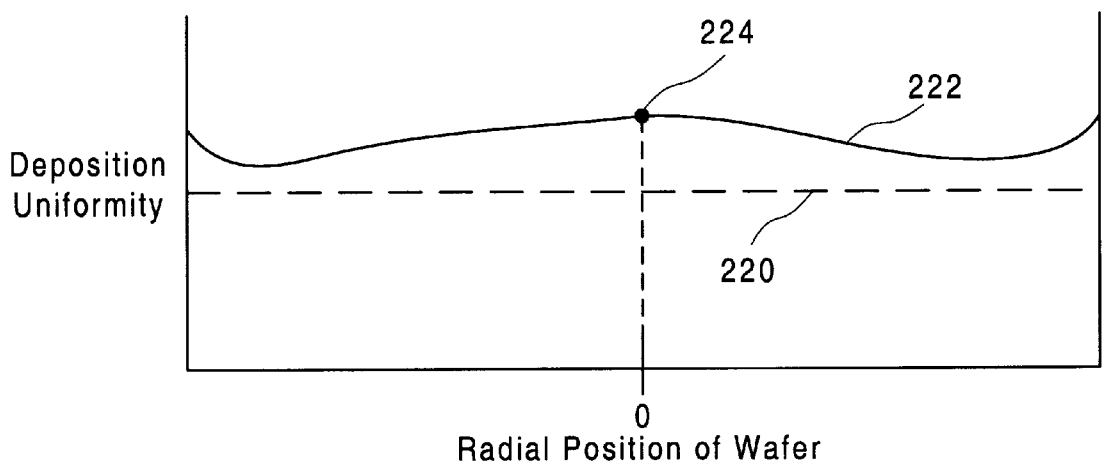
FIG. 2C shows deposition uniformity of a wafer surface over the radial distance after performing plasma deposition in a conventional plasma processing chamber.

In this arrangement, the varying thickness of the electrically isolated portions 504A through 504I in the dielectric layer 504 is adapted to provide varying impedance across the dielectric layer 504. The varying thickness of the dielectric layer 504, in turn, functions to produce varying DC bias, which compensates for non-uniform plasma processing over the wafer by attracting plasma (i.e., ions) in a substantially uniform manner over the entire wafer surface. For example, the electrostatic chuck 502 can be used to compensate for process non-uniformity of wafers illustrated above in FIGS. 2A, 2B, and 2C. Although the lower surface 508 of the dielectric layer 504 is shown to be curved, it may also be in other shape or geometry. Indeed, the dielectric layer 504 may be formed in any shape including but not limited to linear, non-linear, curved, or stair-step shape in accordance with the uniformity characteristics. Additionally, the electrostatic chuck 502 may include a number of other layers disposed over, below, or between the layers 508 and 506.

Figure 5B:
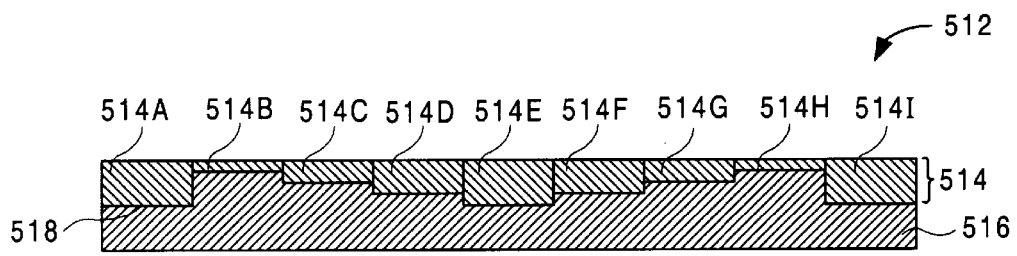
FIG. 5B shows a cross-sectional view of an exemplary electrostatic chuck that compensates for non-uniform process characteristics by means of stair-step geometry.

FIG. 5B shows a cross-sectional view of an exemplary electrostatic chuck 512 that compensates for non-uniform process characteristics by means of stair-step geometry in accordance with another embodiment of the present invention. The electrostatic chuck 512 includes a dielectric layer 514 disposed over an electrode layer 516. The dielectric layer 514 is partitioned into a plurality of portions 514A, 514B, 514C, 514D, 514E, 514F, 514G, 514H, and 514I (hereinafter referred to as "514A to 514I"), each of which are electrically isolated from neighboring portions. A bottom surface 518 of the dielectric layer 514 is shaped in the form of stair-steps due to the varying thickness of the portions 514A through 514I. The electrode layer 516 below the dielectric layer 514 forms a complementary stair-step layer.

The thickness of layer 514 decreases progressively from the center portion 514E to portions 514B and 514H. The edge portions 514A and 514I are substantially thicker than the portions 514B and 514H to compensate for greater plasma concentration over the edge portions of a wafer. The varying thickness of the stair-step shape provides varying impedance over the surface of the electrostatic chuck 512, thereby providing a varying DC bias for attracting plasma (i.e., ions) in a uniform manner over the entire surface of the wafer. The stair-step shape of the dielectric and electrode layers 514 and 516 can be implemented by partitioning the uniformity characteristics (e.g., uniformity curve, table, etc.) into a plurality of regions. Then, the thickness of the dielectric layer can be determined for each of the partitioned regions.

Figure 5C:
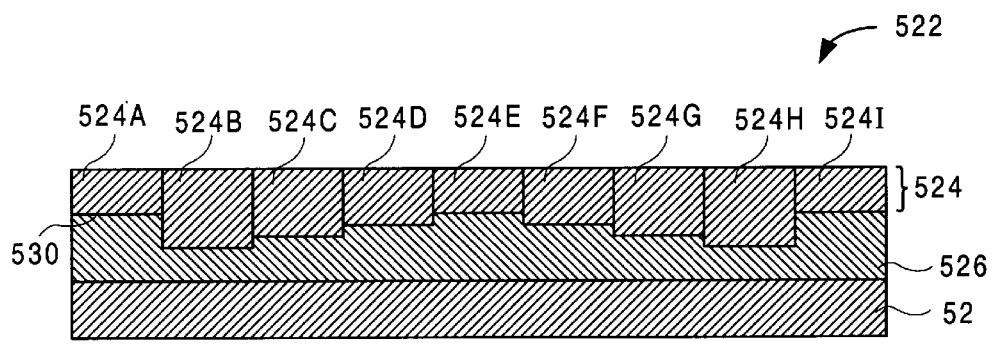
FIG. 5C illustrates a cross-sectional view of an exemplary electrostatic chuck having stair-stepped layers in accordance with another embodiment of the present invention.

Similarly, FIG. 5C illustrates a cross-sectional view of an exemplary electrostatic chuck 522 having stair-stepped layers in accordance with another embodiment of the present invention. In the electrostatic chuck 522, an electrode layer 526 is sandwiched between an upper dielectric layer 524 and a lower dielectric layer 528. The upper dielectric layer 524 is partitioned into electrically isolated portions 524A, 524B, 524C, 524D, 524E, 524F, 524G, 524H, and 524I. A bottom surface 530 of the layer 524 is forms a stair-step shape. The electrode layer 526 complements the stair-step surface 530 of the upper dielectric layer 524.

Figure 5D:
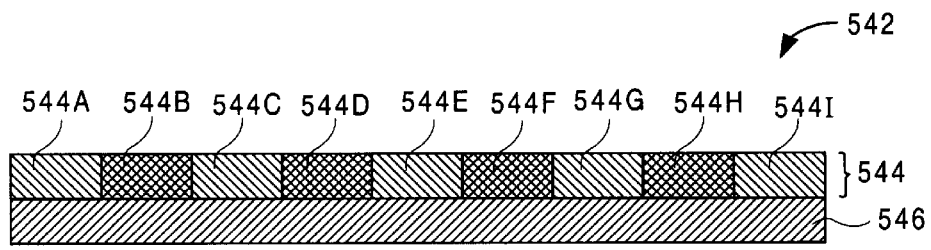
FIG. 5D shows a cross-sectional view of an electrostatic chuck configured to have a plurality of materials in a layer in accordance with one embodiment of the present invention.

The layers of electrostatic chucks and/or upper electrode may be configured with different materials with or without varying the geometry of the layers. For example, FIG. 5D shows a cross-sectional view of an electrostatic chuck 542 configured to have a plurality of materials in a layer in accordance with one embodiment of the present invention. The electrostatic chuck 542 includes a dielectric layer 544 disposed over an electrode layer 546. The dielectric layer 544 is partitioned into a plurality of portions 544A, 544B, 544C, 544D, 544E, 544F, 544G, 544H, and 544I (hereinafter referred to as "544A to 544I"). Each of the portions 544A to 544I is comprised of a material adapted to provide a desired impedance. For example, the uniformity characteristics (e.g., uniformity curve, uniformity table, etc.) can be partitioned into a plurality of regions. Then, the dielectric layer is partitioned into the plurality of portions 548 to 564 corresponding to the partitioned regions of the uniformity characteristics. For each of the partitioned portions 544A to 544I, the impedance needed to compensate for non-uniformity is determined. Each of the partitioned portions 544A to 544I is then formed of a material that provides the necessary impedance. In so doing, the dielectric layer 544 as a whole provides varying impedance to produce varying DC bias over the entire surface of a wafer, thereby attracting plasma (i.e., ions) to the wafer in a uniform manner.

In one embodiment, each of the portions 544A to 544I is comprised of different materials to provide unique impedance. In another embodiment, the portions 544A to 544I may be comprised of materials in a symmetrical fashion with respect to the center portion 556. For example, the portions 544A and 544I may be comprised of an identical material; the portions 544B and 544H may be made of another material; the portions 544C and 544G may have the same material; and the portions 544D and 544F can have yet another material. Such arrangement is well suited to compensate for non-uniformity of symmetrical curves, examples of which were previously illustrated in FIGS. 2B and 2C.

Figure 5E:
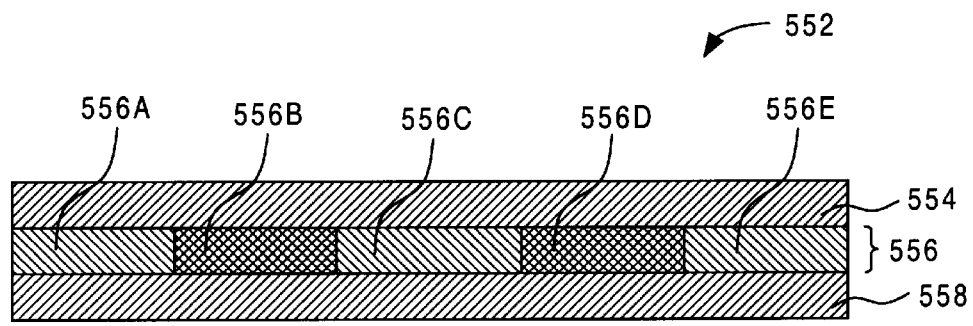
FIG. 5E illustrates a cross-sectional view of an exemplary electrostatic chuck.

FIG. 5E illustrates a cross-sectional view of an exemplary electrostatic chuck 552 in accordance with another embodiment of the present invention. The electrostatic chuck 552 includes an electrode layer 556 disposed between an upper dielectric layer 554 and a lower dielectric layer 558. The electrode layer 556 is partitioned into a plurality of electrically isolated portions 556A, 556B, 556C, 556D, and 556E, each of which is formed of a suitable material to provide a desired impedance. The plurality of portions 556A, 556B, 556C, 556D, and 556E thus provides varying impedance to cause varying DC bias over the surface of the wafer.

Figure 5F:
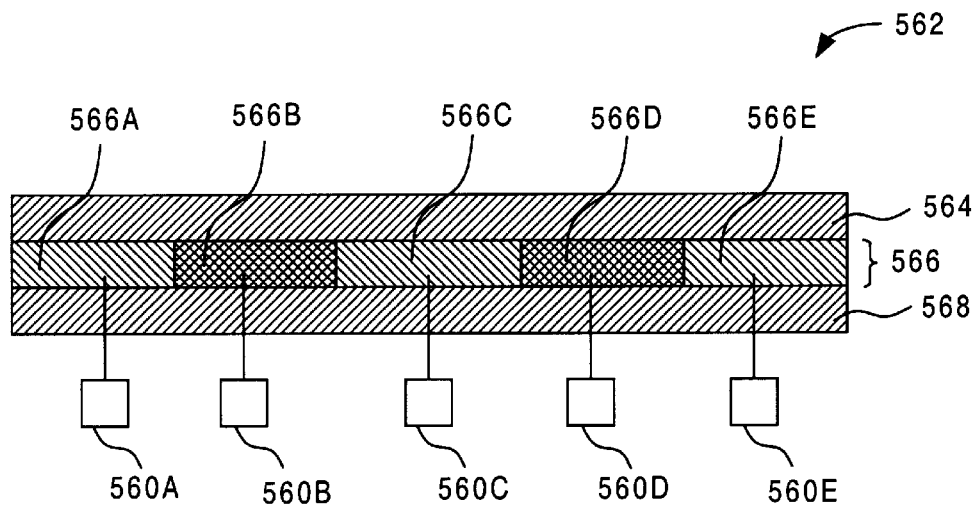
FIG. 5F shows a cross-sectional view of an electrostatic chuck having a plurality of impedance elements in accordance with one embodiment of the present invention.

In addition to configuring the geometry and/or materials, additional impedance elements may be provided to produce desired impedance. For example, an electrode layer in an electrostatic chuck may be coupled to impedance elements. FIG. 5F shows a cross-sectional view of an exemplary electrostatic chuck 562 having a plurality of impedance elements 560A, 560B, 560C, 560D, and 560E in accordance with one embodiment of the present invention. Similar to the electrostatic chuck illustrated in FIG. 5E, the electrostatic chuck 562 includes an electrode layer 566 disposed between a pair of dielectric layers 564 and 568. In the electrostatic chuck 562, however, the impedance elements 560A, 560B, 560C, 560D, and 560E are coupled to electrically partitioned portions 566A, 566B, 566C, 566D, and 566E, respectively, to provide varying impedance across the electrode layer 566. Impedance elements may be any known elements capable of functioning as impedance elements and includes devices such as resistors, capacitors, inductors, or any combination thereof. In FIGS. 5E and 5F, it should be noted that the dielectric layers 554 and 564 over the electrode layers 556 and 566, respectively, may also be partitioned.

Figure 5G:
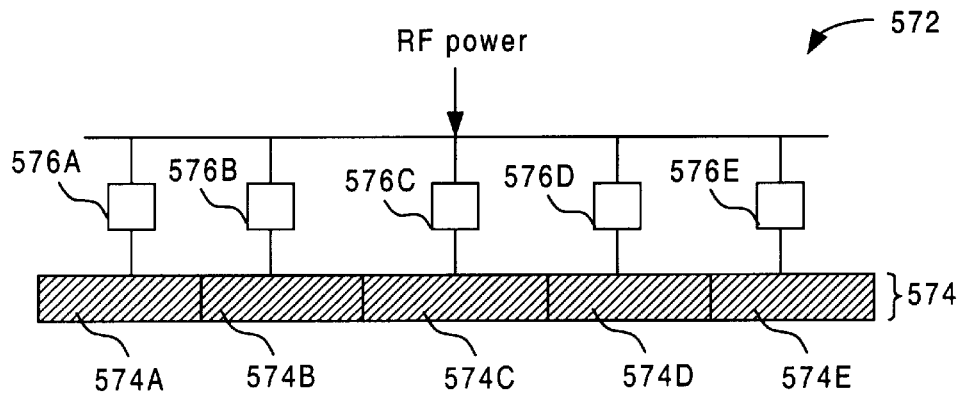
FIG. 5G illustrates a cross-sectional view of an exemplary electrode having a plurality of impedance elements in accordance with one embodiment of the present invention.

The top electrode may also be configured in a manner similar to the electrostatic chuck by configuring its geometry and/or material, or by providing additional impedance elements in accordance with uniformity characteristics. By way of example, FIG. 5G illustrates a cross-sectional view of an exemplary electrode 572 having a plurality of impedance elements 576A, 576B, 556C, 556D, and 556E in accordance with one embodiment of the present invention. The electrode 572 includes an electrode layer 574 and a plurality of impedance elements 576A, 576B, 576C, 576D, and 576E, which are coupled to an RF power supply. The electrode layer 574 is partitioned into a plurality of electrically isolated portions 574A, 574B, 574C, 574D, and 574E, which may be formed of same material or a plurality of different materials. The portions 574A, 574B, 574C, 574D, and 574E are electrically coupled to the impedance elements 576A, 576B, 576C, 576D, and 576E, respectively, which are configured to provide varying impedance in the electrode layer 574 to cause varying DC bias over the surface of the wafer and/or cause varying plasma density distribution. It should be noted that the configuration of electrostatic chuck similarly works to vary the DC bias and/or plasma density distribution in accordance with the described embodiments of the present invention.

Figure 6A:
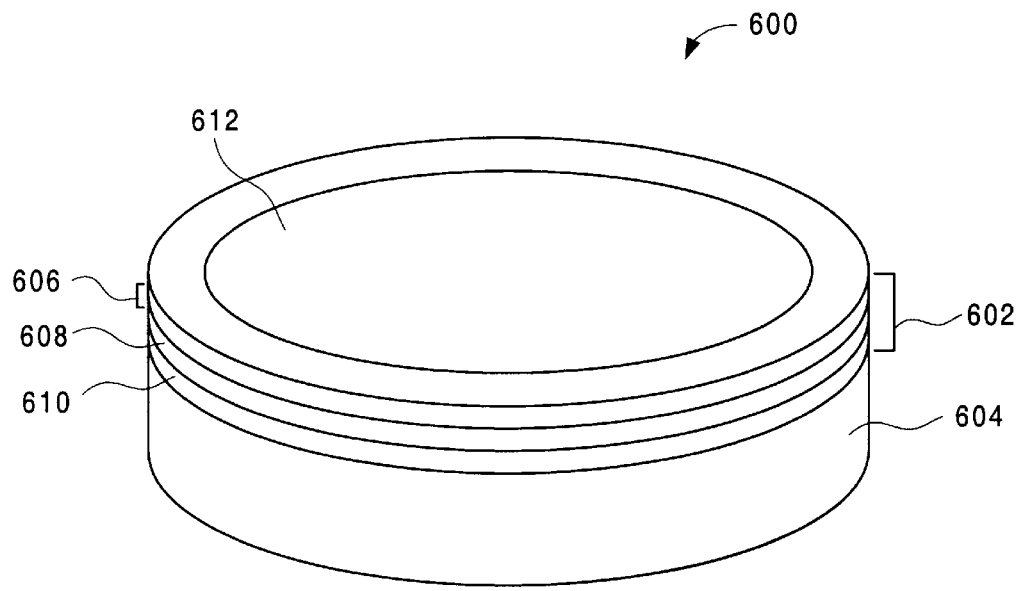
FIG. 6A shows a perspective view of an exemplary electrostatic chuck including an ESC ring disposed over an RF electrode.

In accordance with another embodiment, the present invention provides an ESC ring adapted to compensate for non-uniformity at the peripheral regions of a wafer. For example, FIG. 6A shows a perspective view of an electrostatic chuck 600 including an ESC ring 602 disposed over an RF electrode 604 in accordance with one embodiment of the present invention. The ESC ring 602 forms a ring around the periphery of the electrostatic chuck 600 and includes an electrode layer 608 disposed between an upper dielectric layer 606 and a lower dielectric layer 610. An optional dielectric layer is provided over the RF electrode 604 within the ESC ring 602. Since the ESC ring 602 is smaller than that of conventional electrostatic chucks, the complexity and cost in manufacturing is significantly reduced.

Figure 6B:
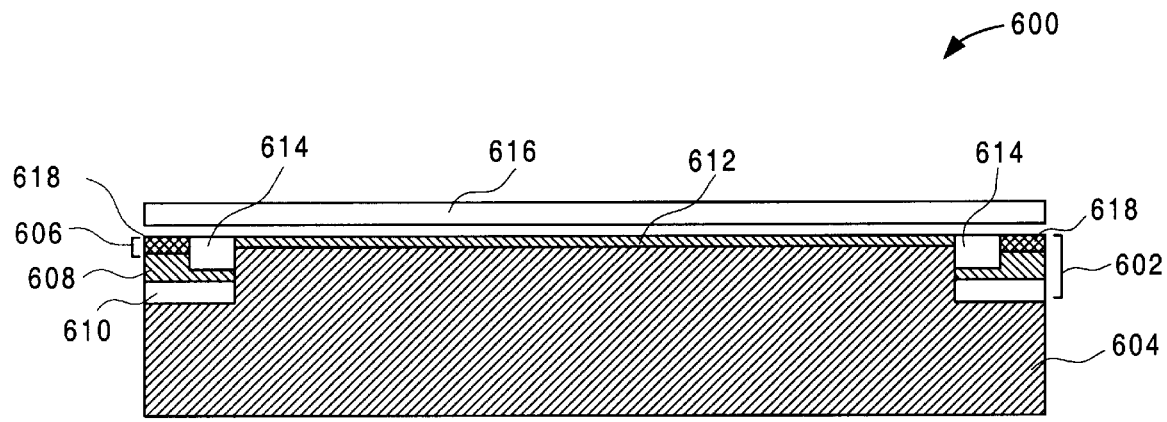
FIG. 6B illustrates a cross-sectional view of the electrostatic chuck showing modified material and geometry of the layer in accordance with one embodiment of the present invention.

FIG. 6B illustrates a cross-sectional view of the electrostatic chuck 600 showing a material and geometry of the layer 606 in accordance with one embodiment of the present invention. The electrostatic chuck 600 clamps a wafer 616 in place for processing. The dielectric layer 606 includes two portions 614 and 618, which are formed of different materials. In addition, the two portions 614 and 618 have different geometry. The impedance of these varying material portions and geometry allows the plasma (i.e., ions) to be attracted more uniformly to the surface of the wafer 616.

Figure 7:
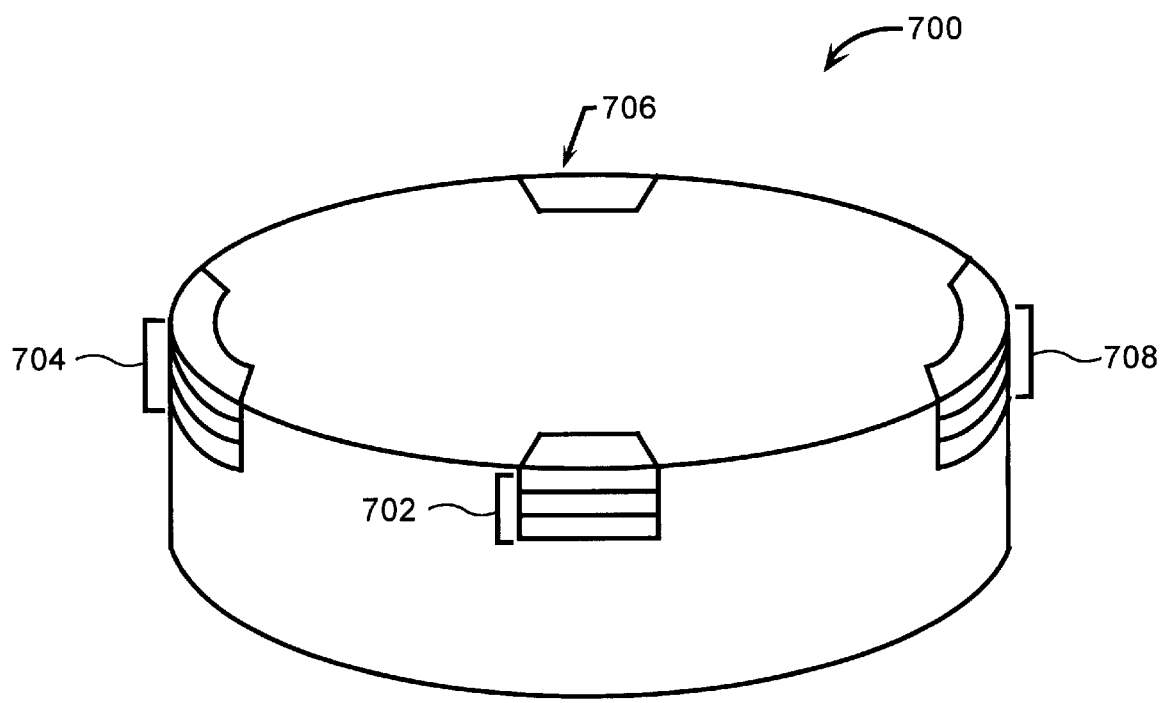
FIG. 7 illustrates a perspective view of an exemplary electrostatic chuck that includes a plurality of portions instead of an ESC ring.

To reduce cost and complexity, the ESC ring 602 can be further simplified. FIG. 7 illustrates a perspective view of an exemplary electrostatic chuck 700 that includes a plurality of portions 702, 704, 706, and 708 instead of the ESC ring 602 in accordance with one embodiment of the present invention. The layers of the portions 702, 704, 706, and 708 may be configured independently or symmetrically to provide desired impedance. Accordingly, the electrostatic chuck 700 saves substantial cost and complexity in manufacturing.

The present invention, a method and apparatus for compensating non-uniform wafer processing in a plasma processing chamber, is thus described. While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for compensating non-uniform wafer processing in a plasma processing chamber having an electrostatic chuck for clamping a wafer, said electrostatic chuck having a plurality of layers, the method comprising:

processing a first wafer on an electrostatic chuck in a first plasma processing chamber, said first wafer being exposed to a plasma in said first plasma processing chamber;

determining non-uniformity characteristics of said processed first wafer;

configuring one or more layers of said electrostatic chuck to substantially compensate for said non-uniformity characteristics on said first wafer; and processing a second wafer on said configured electrostatic chuck.

2. The method as recited in claim 1, wherein said non-uniformity characteristics of said processed first wafer is determined by measuring said processed first wafer at a plurality of radial positions.

3. The method as recited in claim 2, wherein said non-uniformity characteristics is generated by obtaining a uniformity curve showing a relationship between said processed first wafer and said radial positions.

4. The method as recited in claim 1, wherein a specified layer among said one or more layers is partitioned into a plurality of electrically isolated portions.

5. The method as recited in claim 4, wherein said specified layer is arranged in a shape of varying thickness characterized by varying impedance, wherein said varying impedance is capable of producing varying DC bias on said wafers such that said non-uniformity characteristics are substantially compensated.

6. The method as recited in claim 4, wherein each of said partitioned portions are formed of different materials having different impedance characteristics capable of producing varying DC bias on said wafers such that said non-uniformity characteristics are substantially compensated.

7. The method as recited in claim 5, wherein said partitioned portions are formed of a same material.

8. The method as recited in claim 5, wherein said shape is a stair-step.

9. The method as recited in claim 5, wherein said shape is a curve.

10. The method as recited in claim 4, wherein said partitioned portions contain a plurality of materials, one material per partition.

11. The method as recited in claim 1, wherein said electrostatic chuck has a base layer, wherein said one or more layers are disposed on said base layer along the outer periphery of said base layer.

12. The method as recited in claim 11, wherein said one or more layers are disposed on said base layer to form a ring.

13. The method as recited in claim 1, wherein said configured electrostatic chuck is placed in a second processing chamber for processing said second wafer.

14. The method as recited in claim 4, wherein said plasma includes ions and wherein said operation of configuring one or more layers comprises:

selecting said specified layer of said electrostatic chuck;

determining impedance each of the partitioned portions of the selected layer for providing DC bias to said second wafer, said DC bias for attracting said ions in a substantially uniform manner to said first wafer; and configuring said selected layer to attract ions of a second plasma in a substantially uniform manner to said second wafer.

15. The method as recited in claim 14, wherein said selected layer is configured in a shape to provide said impedance.

16. The method as recited in claim 4, wherein said electrostatic chuck includes an electrode layer, wherein said electrode layer is partitioned into said plurality of portions, wherein said electrostatic chuck further includes a plurality of impedance elements coupled to said partitioned portions so as to provide varying DC bias on said wafers such that said non-uniformity characteristics are substantially compensated.

17. The method as recited in claim 1, wherein said plasma processing chamber has an electrode disposed over said wafer, wherein said electrode includes a plurality of electrically partitioned portions that are configured to substantially configured to compensate for said non-uniformity characteristics on said first wafer.

18. The method as recited in claim 17, wherein said electrode is arranged in a shape that is adapted to compensate for said non-uniformity characteristics.

19. The method as recited in claim 17, wherein said electrode is arranged to have a plurality of materials that are adapted to compensate for said non-uniformity characteristics.

20. The method as recited in claim 17, wherein a plurality of impedance elements are coupled to said partitioned portions so as to provide varying DC bias on said wafers such that said non-uniformity characteristics are substantially compensated.

21. The method as recited in claim 1, wherein said one or layers include a dielectric layer.

22. The method as recited in claim 1, wherein said one or more layers include an electrode layer.

23. A method for compensating non-uniform plasma processing in a plasma processing chamber having an electrostatic chuck for clamping a wafer, said processing chamber having an electrode disposed over said wafer, the method comprising:

processing a first wafer on said electrostatic chuck in a first plasma processing chamber, said first wafer being exposed to a plasma between said electrostatic chuck and an electrode in said first plasma processing chamber;

determining non-uniformity characteristics of said processed first wafer;

configuring said electrode into a plurality of electrically partitioned portions to substantially compensate for said non-uniformity characteristics on said first wafer; and processing a second wafer on said configured electrode.

24. The method as recited in claim 23, wherein said non-uniformity characteristics of said processed first wafer is determined by measuring said processed first wafer at a plurality of radial positions.

25. The method as recited in claim 24, wherein said non-uniformity characteristics are determined by generating a uniformity curve showing a relationship between said processed first wafer and said radial positions.

26. The method as recited in claim 23, wherein said electrode is arranged in a shape that is adapted to compensate for said non-uniformity characteristics.

27. The method as recited in claim 23, wherein said electrode arranged to have a plurality of materials that are adapted to compensate for said non-uniformity characteristics.

28. The method as recited in claim 23, wherein said electrode is arranged to have a plurality of materials and in a shape such that said non-uniformity characteristics are substantially compensated.

29. An electrostatic chuck for clamping a wafer during plasma processing in a plasma processing chamber, comprising:
   a first layer having a varying first impedance adapted to produce a varying DC bias over said wafer such that ions in a plasma in said plasma processing chamber are attracted to said wafer in a substantially uniform manner over said wafer; and
   an electrode disposed under said first layer for transmitting RF power to said plasma.

30. The electrostatic chuck as recited in claim 29, wherein said first layer is partitioned into a plurality of electrically isolated portions that are arranged in a shape adapted to provide said varying impedance.

31. The electrostatic chuck as recited in claim 30, wherein said partitioned portions are arranged to have a plurality of materials that are adapted to provide said varying impedance.

32. The electrostatic chuck as recited in claim 29, wherein said varying impedance is produced by configuring said first layer to have a plurality of materials and in a shape so as to attract said ions to said wafer in said uniform manner.

33. The electrostatic chuck as recited in claim 29, wherein said first layer is a dielectric layer.

34. The electrostatic chuck as recited in claim 29, wherein said electrostatic chuck includes one or more dielectric layers and wherein said first layer is an electrode layer.

35. The electrostatic chuck as recited in claim 29, wherein said first layer includes at least one dielectric layer and an electrode layer.

36. The electrostatic chuck as recited in claim 34, wherein said electrostatic chuck includes an electrode layer, wherein said electrode layer is partitioned into a plurality of portions, wherein a plurality of impedance elements is coupled to said partitioned portions so as to provide varying DC bias on said wafer such that said non-uniformity characteristics are substantially compensated.

* * * * *